United States Patent
Coyne

(10) Patent No.: US 9,202,934 B2
(45) Date of Patent: Dec. 1, 2015

(54) JUNCTION FIELD EFFECT TRANSISTOR, AND METHOD OF MANUFACTURE THEREOF

(71) Applicant: ANALOG DEVICES GLOBAL, Hamilton (BM)

(72) Inventor: Edward John Coyne, Athenry (IE)

(73) Assignee: ANALOG DEVICES GLOBAL, Hamilton (BM)

( * ) Notice: Subject to any disclaimer, the term of this patent is extended or adjusted under 35 U.S.C. 154(b) by 29 days.

(21) Appl. No.: 14/055,738

(22) Filed: Oct. 16, 2013

(65) Prior Publication Data

US 2015/0102391 A1    Apr. 16, 2015

(51) Int. Cl.
| | | |
|---|---|---|
| H01L 29/80 | (2006.01) | |
| H01L 31/112 | (2006.01) | |
| H01L 29/808 | (2006.01) | |
| H01L 29/66 | (2006.01) | |
| H01L 29/08 | (2006.01) | |
| H01L 29/10 | (2006.01) | |

(52) U.S. Cl.
CPC .......... *H01L 29/808* (2013.01); *H01L 29/0843* (2013.01); *H01L 29/1058* (2013.01); *H01L 29/66893* (2013.01); *H01L 29/66901* (2013.01)

(58) Field of Classification Search
CPC .......................... H01L 29/88; H01L 29/66893
USPC ........................................................ 257/270
See application file for complete search history.

(56) References Cited

U.S. PATENT DOCUMENTS

| | | | |
|---|---|---|---|
| 4,602,419 A | | 7/1986 | Harrison et al. |
| 5,892,264 A | * | 4/1999 | Davis et al. .................. 257/511 |
| 7,969,243 B2 | * | 6/2011 | Bracale et al. ............... 330/277 |
| 2004/0065896 A1 | | 4/2004 | Sakamoto |
| 2005/0269660 A1 | | 12/2005 | Singh |
| 2007/0145410 A1 | | 6/2007 | Wilson et al. |
| 2014/0001518 A1 | * | 1/2014 | Huang et al. ................. 257/270 |
| 2015/0054038 A1 | * | 2/2015 | Masliah et al. ............... 257/262 |

FOREIGN PATENT DOCUMENTS

| | | |
|---|---|---|
| GB | 2069236 | 8/1981 |
| JP | 56-98876 | 8/1981 |
| JP | 57-128069 | 8/1982 |
| JP | 2008-153445 | 7/2008 |
| WO | WO 2011053932 | 5/2011 |

OTHER PUBLICATIONS

Extended European Search Report of Feb. 18, 2015 for European Patent Application No. 14188003.9, 9 pages.
Office Action in corresponding Japanese Patent Application No. 2014-169086, mailed Sep. 30, 2015. 7 pages, 10 page translation.

* cited by examiner

*Primary Examiner* — David S Blum
(74) *Attorney, Agent, or Firm* — Knobbe, Martens, Olson & Bear, LLP

(57) ABSTRACT

A method of forming a junction field effect transistor, the transistor comprising: a back gate; a channel; a top gate; a drain and a source in current flow with the channel; wherein the method comprises selecting a first channel dimension between the top gate and the back gate such that a significant current flow path in the channel occurs in a region of relatively low electric field strength.

20 Claims, 8 Drawing Sheets

JUNCTION FIELD EFFECT TRANSISTOR, AND METHOD OF MANUFACTURE THEREOF

FIELD OF THE INVENTION

This disclosure relates to an improved junction field effect transistor and a method of manufacture of such a transistor.

BACKGROUND

Junction field effect transistors comprise a source and a drain which are connected together by way of a first doped region of semiconductor. Current flow in the junction field effect transistor is provided by a gate formed by a second doped region of semiconductor within the first doped region. For convenience the space between the drain and source is often referred to as a channel, but this terminology can be imprecise. Herein the following terminology will be used:
  1) The portion of the first doped region between the gate and the back gate will be called the first channel region.
  2) The portion of the first doped region between the gate and the drain will be called the second channel region.
  3) The portion of the first doped region between the gate and the source will be called the third channel region.

The first doped region and the second doped regions are oppositely doped, thus a P doped gate may be formed in a N-type channel.

Within the device, the "current flow" occurs as a result of movement of the majority carriers. The majority carriers are electrons in an N-type semiconductor and are holes in a P-type semiconductor. The term current flow path relates to the movement of the majority carriers to create a current flow through the transistor. Junction field effect transistors do not have an insulating region between the gate and the channel. This means that a gate current may flow when the device is passing a current between its drain and source. It is desirable for the gate current to have a low value.

SUMMARY OF THE INVENTION

Disclosed herein is a method for designing a junction field effect transistor so as to reduce a gate current from the device for a given drain-source voltage across the device.

In accordance with a first aspect of this disclosure there is provided a method of forming or designing the layout of a junction field effect transistor, the transistor comprising: a back gate; a channel; a top gate; and a drain and a source in current flow communication with the channel; the method comprising selecting a first channel dimension such that a significant current flow path in the channel occurs in a region of relatively low electric field.

Advantageously current flow in the space between the top gate and the back gate (the first channel region) is primarily in a region of low electric field. The back gate may also be referred to as a bottom gate.

Low electric field at a current flow path inside the first channel region can be achieved as a result of a balance between the top-gate—channel electric field and the opposing bottom-gate—channel electric field. With suitable selection of device dimensions where the current flows along a field neutral path between the top and bottom (back) gates. However, in prior art devices as the current emerges from the first channel region, it moves into a region where the electric fields from the top and bottom gate no longer balance and the combination of a high current density with a high electric field results in impact ionization and a high gate current.

Devices disclosed in this document solve or mitigate this problem. The inventor realized that the electric field beyond the first channel region can be regarded as a 2D problem between the top and back/bottom gates, and that by arranging the relative geometries of the device appropriately, it is possible to convey the channel current along a path of balanced electric fields between the bottom-gate and the drain and between the top-gate and the drain.

The diffusions that define the bottom-gate of the device are generally performed early in the process of the JFET fabrication. This results in those diffusions having a graded profile. Therefore, the back-gate—channel junction can be approximated by a linear graded junction. The top-gate, being at the surface of the device has a lower thermal budget and is generally more highly doped to produce a low gate resistance for the purpose of reducing noise. Therefore, the top-gate—channel junction can reasonably be approximated by a one sided PN junction. The difference between a linear graded junction, and one sided PN junction means that for the same potential the electric field from the top-gate is twice that of the bottom gate. In the first channel region, a neutral path between the opposing fields of the top and bottom gate and that defines the current path is approximated by a 1:2 ratio across the channel width.

In use the current travels beyond the first channel region. The inventor realized that the top-gate and bottom-gate electric fields can be further balanced to form a low E-field region. This can be achieved if the distance from the top-gate is substantially twice that of the distance from the bottom-gate. In a device, a lateral distance "dc" from the top-gate to the drain diffusion is generally defined as a minimum distance such that a reverse biased electric field does not breakdown the device before the device reaches its full operating voltage (i.e., its intended maximum operating voltage). Therefore, to substantially balance the field at all points towards the drain contact, it is desirable for the vertical depth "W2ch" to the backgate diffusion to be substantially half that of the lateral distance "dc" from the top-gate. This is a reasonable first approximation to achieving the desired performance.

The inventor realized that the diffusion for the drain ohmic contact affects the vertical electric field of the back-gate so that 1:2 balance between the electric fields is no longer valid. To continue to maintain this field balance for the current path, it is desirable to provide an extra lateral separation between the top-gate and drain to give rise to a total separation Ld. The effective ratio between the width "Ld" and the back-gate depth "W2ch" may then be described by:

$$W2ch = \frac{Ld}{3.5}$$

As a result of diffusion tolerances, this same condition can be maintained within a range of about 3 to 4 for the lateral to vertical ratio of the channel—drain region.

$$W2ch = \frac{Ld}{\beta}$$

$$\beta = 3 - 4$$

This condition maintains a field equilibrium path for the current from the first channel region to the drain for reduced or minimum impact ionization. However, for this design to be utilized, it is desirable for the channel current to be aligned to that path. Previously, it has been established that the current in the first channel region is positioned at a ratio of 1:2 of the distance between the bottom-gate and top-gate. For a measured or given top-gate depth "Wtg", and a measured or given channel width "Wch" the vertical position "di" of the current path can be approximated by:

$$di = Wtg + \frac{2Wch}{3}$$

These dimensions are schematically illustrated in FIG. 2.

For this current to be injected into the field neutral path of the channel—drain region, it is desirable for this current to be positioned along the 1:2 distance between the bottom and top gates beyond the channel.

$$di = Wtg + \frac{2Wch}{3} = \frac{2(W2ch - Wtg)}{3} + Wtg$$
$$\therefore Wch = W2ch - Wtg$$

It is therefore advantageous if the channel depth (Wch+Wtg) is substantially equal to the back-gate depth "W2ch" beyond the first channel region boundary. This can be achieved by providing the same bottom-gate depth across the entire device. However, for enhanced control the bottom-gate depth in the first channel region can be made different from the channel-drain bottom-gate depth "W2ch".

This is possible because the channel defined bottom-gate junction has, in use, depletion regions spreading from 2 directions; vertically from the channel and laterally from the channel-drain region. This weakens the bottom-gate channel electric field which means that the channel current is closer to the channel bottom-gate and as a result, it can be injected into field neutral path of the channel-drain region. We can equate the vertical positions, di, by:

$$di = Wtg + Wch \text{ (In channel region)}$$
$$di = \frac{2(W2ch - Wtg)}{3} + Wtg \text{ (Leaving Channel region)}$$
$$\therefore Wch = \frac{2(W2ch - Wtg)}{3}$$

In general for both device architectures, this tolerance can be expressed as:

$$Wch = \alpha(W2ch - Wtg)$$

$$\alpha = 0.5 - 1.0$$

Appropriate selection of the channel depth also facilitates positioning the first channel region current path away from the corner of the top-gate. As a result of processing constraints, the top gate has a smaller radius of curvature and as known to the person skilled in the art, this gives rise to stronger electric fields. Selection of the channel width Wch in the first channel region can be used to move the significant current path away from the areas of high electric field strength, or where the field strength exceeds a maximum permitted E-field value that would initiate impact ionization at the end of the channel region.

A similar corner electric field also exists at the drain contact where, in prior art devices, a relatively high current density along the surface to the device towards the drain also exists within a region of high electric at the drain corner. The inventor realized that, to mitigate this problem, it is desirable to use a drain diffusion that moves the drain corner away from the surface current path. This can be achieved by forming a relatively deep drain. A vertically deep drain diffusion around the drain contact moves the drain to backgate electric field (in particular the drain corner electric field) away from the surface of the device where the current flows towards the drain contact to exit the device. It is advantageous for the drain depth "Wd" to be at least 0.5 µm. This extra drain diffusion does not need to grade the electric field, but only serves to vertically separate the device current in the second channel region from the highest electric fields at the drain.

Existing device architectures can facilitate positioning of the current along substantially E-field neutral paths and away from corner fields that would initiate or enhance impact ionization to produce a gate current. However, defects within the gate region can also generate minority carriers in the form of a leakage current and device noise. To reduce both of these artifacts, it is possible to use "out diffusion" from polysilicon to form the top-gate. This process strategy involves depositing polysilicon on the surface of the device in the top-gate region and implanting the polysilicon, or otherwise providing a highly doped layer at the surface. Thermal diffusion can then be performed which drives the dopant into the silicon beneath the highly doped layer to form the top-gate. This approach prevents the formation of defects attributed to implant damage that may limit the performance of the device.

According to a second aspect of this disclosure there is also provided a junction field effect transistor comprising a channel, a gate, a drain and a source, wherein the drain and source are in controllable current flow communication by way of the channel, and wherein a first channel dimension is selected such that a significant current flow path in the channel occurs in a region where the electric field strength is below a threshold.

The threshold may be a value at which impact ionization is expected to cause an undesirable gate current for a given drain-source voltage.

It is thus possible to provide a JFET comprising a channel of a first type of a semi-conductor formed between a source and a drain of the JFET, the channel being bounded on a first side by a first region of a second type of semi-conductor and having a first gate region extending from a second side of the channel towards the first side of the channel so as to form a channel region of reduced thickness, wherein the relative dimensions of the first gate region and the gate to drain separation are selected such that in a working device a current flowing in the channel is directed away from the regions of high electric field intensity.

Advantageously the dimensions of the gate, drain and channel are configured such that the majority of the channel current flows along a path of reduced, and preferably substantially zero, E-field.

The JFET may be formed as a horizontal device. Thus in such a horizontal device the source and drain are formed at substantially the same depth as each other from a surface of the semiconductor. The drain and source may be linear structures separated laterally from one another. Alternatively the drain may be encircled by the source, or vice versa. This is because a transistor is a three dimensional object.

The first region of the second type of semiconductor located on the first side of the channel may be a back gate located beneath the channel. The first gate region forms the top gate of such a device.

Preferably the current in a region of the channel adjacent the top gate flows along a path where the E-field from the top gate is substantially countered by the E-field from the bottom gate. Thus there is little, and indeed substantially no, impact ionization in the channel region beneath the top gate because there is little or no net electric field along the significant current conduction path. The current can be regarded as flowing along a neutral path.

In devices fabricated in accordance with this disclosure the device geometry and optionally the doping concentrations are selected such that current existing along the neutral path beneath the top gate approximately aligns with a gate-drain region where a low E-field region has been established, such that the current can continue to flow in regions of relatively low E-field.

The profiling of the device may include modifying a depth or length of the top gate, and/or modifying the depth or length of the channel, and/or modifying the profile of the channel at or along the top gate, and/or modifying the depth of the drain. In addition to these charges in physical dimensions, the doping concentrations may also be modified.

In accordance with further aspects of this disclosure there is provided an integrated circuit where transistors therein are designed in accordance with the method disclosed herein, or are fabricated in accordance with the teachings of this document.

BRIEF DESCRIPTION OF THE DRAWINGS

Embodiments of field effect transistors, and a discussion of design considerations relating to such transistors, will be now described, by way of non-limiting example, with reference to the accompanying drawings, in which.

DETAILED DESCRIPTION OF THE PREFERRED EMBODIMENT

Figure 1:
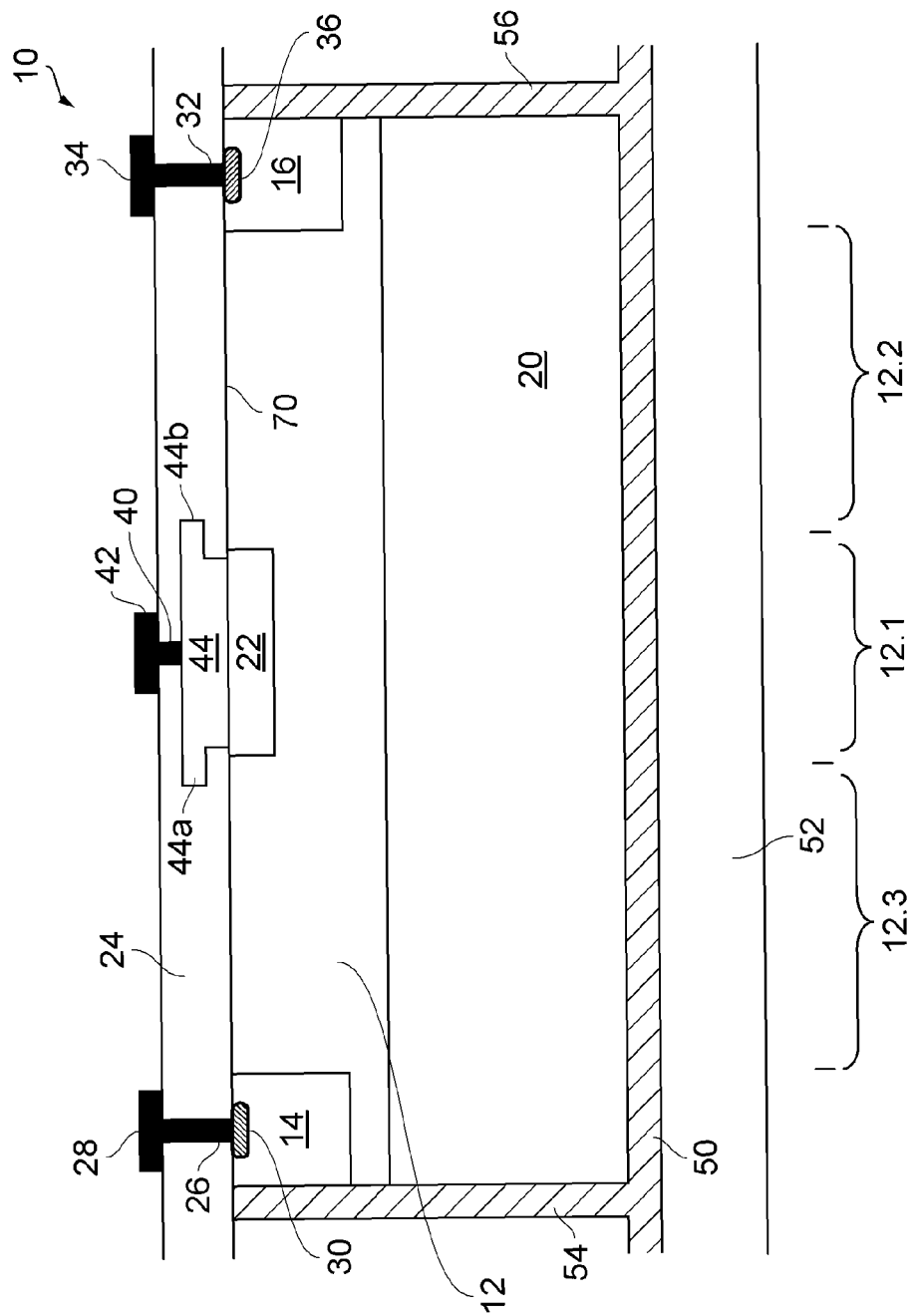
FIG. 1 is a schematic cross section of an embodiment of an improved junction field effect transistor in accordance with the teachings of this document.

In the description given herein, terms such as above, below, beside and so on are to be interpreted with respect to the drawing to which they refer and not limiting with respect to a device formed in accordance with the disclosure of this document.

Additionally, for simplicity doped regions within a device are shown as having rectangular shapes with abrupt edges. The person skilled in the art will appreciate that the edges of the doped regions are spatially diffuse, and rounded, due to diffusion of impurities during manufacture of a device.

FIG. 1 schematically illustrates an embodiment of an improved junction field effect transistor. A field effect transistor generally indicated 10 in FIG. 1 comprises a channel 12 of a first type of semi-conductor, for example N-type semi-conductor formed between a source 14 and a drain 16. The drain and source are also formed of the first type of semi-conductor, but are more heavily doped than the channel. The channel 12 is formed above a first region 20 of a second type of semi-conductor. This region 20 which in the arrangement shown in FIG. 1 is beneath the channel is often referred to as the back gate of the field effect transistor. A top gate is formed by a second region 22 of the second type of semi-conductor which is implanted into the channel 12. The channel 12 in the completed device can be regarded as being sub-divided into three regions:
1) a first channel region 12.1 beneath the top gate 22,
2) a second channel region 12.2 between the top gate 22 and the drain 16, and
3) a third channel region 12.3 between the top gate 22 and the source 14.

The device is typically covered by a layer of passivation material 24, such as silicon dioxide or silicon nitride so as to protect the device from contamination. In order to make electrical contact to the device, a metallic "via" 26 extends through the passivation 24 so as to interconnect a metallic contact 28 with the source 14. A region 30 of enhanced doping may be formed at the junction between the source and the metallic via so as to reduce contact resistance. A similar structure comprising a via 32, a metallic contact 34, and a region of enhanced doping 36 is also formed in the drain 16. The vias need not be metallic.

A gate connection is made to the gate doping 22. The gate connection may comprise a via 40 extending through the passivation material 24 so as to connect the gate region 22 to a gate terminal 42. Additionally, as shown, a "re-surf" structure 44 in the form of a region of polysilicon may form the connection between the via 40 and the gate doping 22. The re-surf region 44 may be profiled so as to form overhanging field plates 44a and 44b.

The transistor 10 may be formed within a reverse-biased well so as to isolate it from an underlying substrate. Such an arrangement is well known to the person skilled in the art. Alternatively, and as shown in FIG. 1, the transistor may be formed within an isolated well. Thus, the back gate 20 may be bounded by a layer of silicon dioxide 50 which is carried on a handle wafer 52. Similarly the transistor may be bounded by lateral walls 54 and 56. Given that a transistor is a three dimensional device, other insulating walls extend from the passivation material 24 towards the insulating region 50 in front and behind the plane of FIG. 1 so as to form a box like structure in which transistor 10 is formed. The relative positions, and particularly the depths of the top gate region 22, drain 16 and the depth of the channel 12 are selected and profiled so as to regions of relatively intense electric fields within the device that are separated from those regions carrying the current between the drain and source. The interface between the doped semiconductor regions forming the drain, source, and channel, and the passivation material 24 can be regarded as defining an upper surface 70 of the device.

Figure 2:
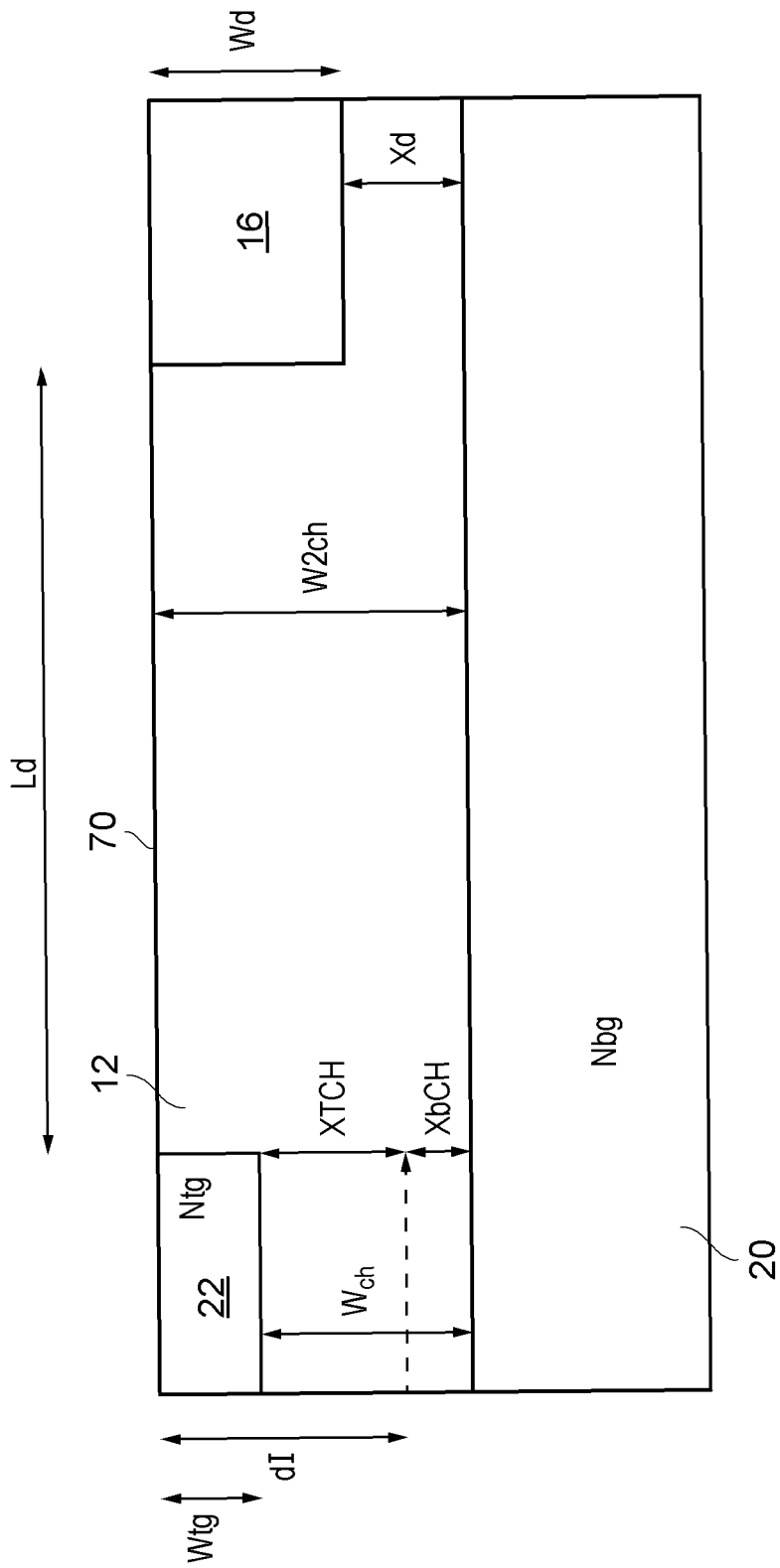
FIG. 2 illustrates some of the dimensions in the device of FIG. 1.

FIG. 2 shows half of the device of FIG. 1 in schematic detail. Thus, the section between the mid-point of the top gate 22 to the drain 16 is shown in diagrammatic form. The channel 22 has a first channel dimension in the region between the top gate 22 and the bottom gate 20. This dimension is schematically indicated as Wch and corresponds to a "width" (in the vertical dimension) of the first channel region 12.1. The second and third regions 12.2 and 12.3 of the channel 12 between the top gate 22 and the drain 16 and between the top gate 22 and the source 12 have a greater spatial extent, or depth, indicated in FIG. 2 as W2ch. The drain 16 extends downwardly from the upper surface 70 of the semi-conductor forming the device by a distance Wd. The notional gap from the bottom of the drain 16 to the top of the back gate 20 is indicated as Xd. The spacing between the top gate 22 and the drain 16 is identified as Ld.

The back gate is doped at a concentration Nbg, and the top gate 22 is doped at a concentration Ntg. These doping concentrations affect the extent to which a depletion region forms around the junction between the top gate 22 and the channel 12, and between the bottom gate 20 and the channel 12. By controlling the relative dopings and hence the spatial extent of the depletion regions for a given gate to source voltage, it becomes possible to determine roughly how deeply within the device the majority of the current, normally referred to as the drain current, flows within the channel region beneath the top gate 22. In use the top gate doping Ntg is greater than the bottom gate doping Nbg such that the current tends to flow at depth di in the region beneath the top gate 22. In the channel region, the position of the current di is determined by the neutral point between the two opposing fields of the top and bottom gate. However, when this current leaves the first channel region 12.1 it is advantageous that it is also injected into the similar field neutral path from the top and bottom gates to the drain. Since the bottom-gate—channel junction can be approximated by a linearly graded junction and the top-gate by a step junction, it means that di is approximately twice the distance from the top-gate 22 as the bottom-gate 20 for them to cancel with equal potential on the device terminals. From inspection of FIG. 2

$$di = Wtg + \frac{2Wch}{3} \text{ (In channel region)}$$

$$di = \frac{2(W2ch - Wtg)}{3} + Wtg \text{ (Leaving Channel region)}$$

$$\therefore Wch = W2ch - Wtg$$

A nominal distance between the current flow path and the back gate 20 is labeled XBCH (=Wch/3) and the corresponding distance between the nominal current flow path and the bottom of the top gate is labeled XTCH (=2Wch/3).

In an embodiment the dimension Wch is greater than about 0.7 microns. This, in combination with a selection of the doping levels ensures that the current flow beneath the top gate 22 is at a sufficient depth to avoid significant fringing fields occurring at the corner of the top gate 22.

Additionally, the depth of the drain Wd is selected to be reasonably deep. In an embodiment, the depth of the drain Wd is at least equal to or greater than about 0.5 µm.

Figure 3A:
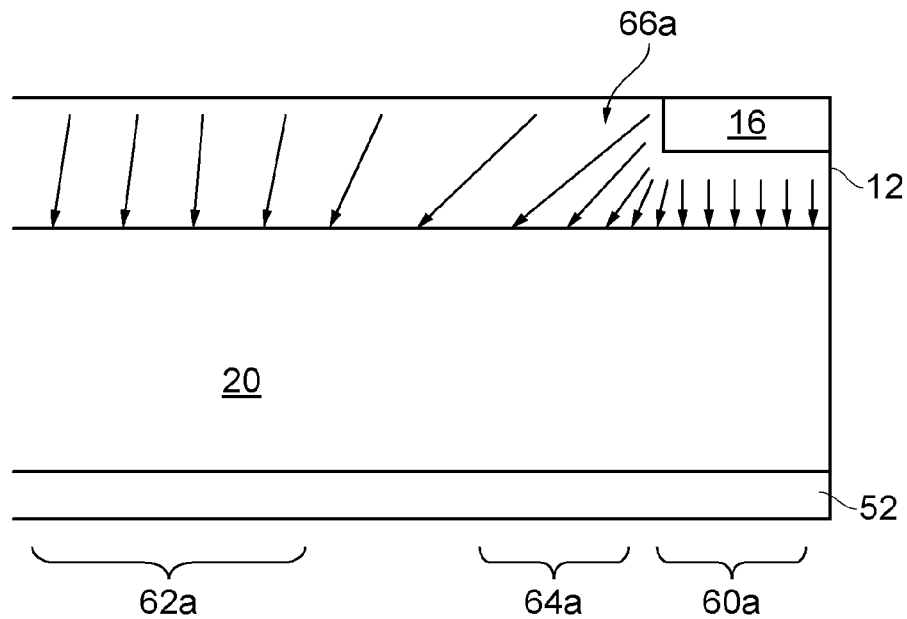
FIGS. 3a and 3b schematically illustrate electric field directions between the source and the bottom gate in a prior art device and in a device formed in accordance with the teachings of this disclosure, respectively.
Figure 3B:
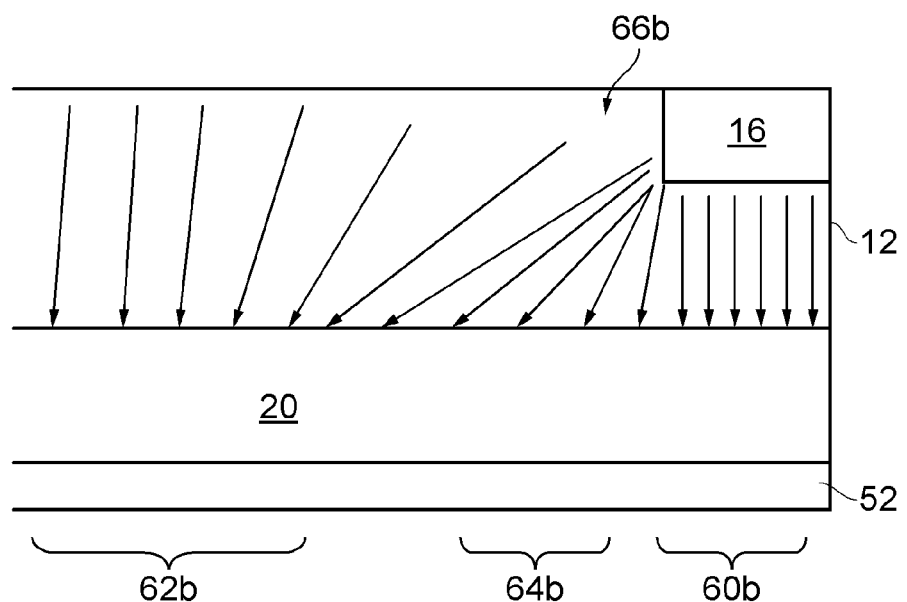

Each of these choices affects the device in a different way. FIGS. 3a and 3b schematically show electric field vectors around the drain region 16 of two field effect transistors.

In FIGS. 3a and 3b the total device depth is notionally the same from the passivation (not shown) to the handle wafer 52 which supports the substrate 20. However the device in FIG. 3b has a channel 12 which has a greater depth W2ch than the channel depth of the device shown in FIG. 3a. In each case the potential difference acting on the device is assumed to be the same, such that the drain of the device in FIG. 3a is at the same voltage as the drain of the device in FIG. 3b, and that the back gate voltage applied to the back gate 20 of each of the devices is also the same. In a first region generally designated 60a in FIGS. 3a and 60b in FIG. 3b that is located directly beneath the drain 16 the electric fields extend substantially normal to the interface between the back gate 20 and the channel 12. Thus in each case the E-field direction is substantially the same although it follows that since the voltage difference in FIG. 3b is the same as that in FIG. 3a, but is acting across a greater physical distance, then the electric field strength in the region 60b is less than the corresponding electric field strength in the region 60a. Similarly, in regions 62a and 62b located at some distance from the drain 16 the E-field is once again substantially perpendicular (or normal) to the interface between the back gate 20 and the channel 12. However, once again, the actual electric field strength is less in the device of FIG. 3b compared to that in the device of FIG. 3a by virtue of the same voltage difference being dropped across a greater distance. In regions designated 64a for the device shown in FIGS. 3a and 64b for the device shown in FIG. 3b adjacent the edge of the drain 16, the E-field extends both laterally and downwardly. However, as the drain is very heavily doped compared to the channel it follows that the drain is more conductive and hence behaves more like an equipotential surface than the channel does. This tends to mean that the E-field vectors tend to originate from the base of the drain 16. Where the drain is deeper, as shown in FIG. 3b, this means that there is a region of reduced E-field near the top of the drain, as indicated generally by region 66b. The corresponding region 66a in FIG. 3a is less spatially extensive, or less well developed, resulting in a greater electric field strength existing near the upper surface of the device shown in FIG. 3a compared to that of the device shown in FIG. 3b.

Figure 4:
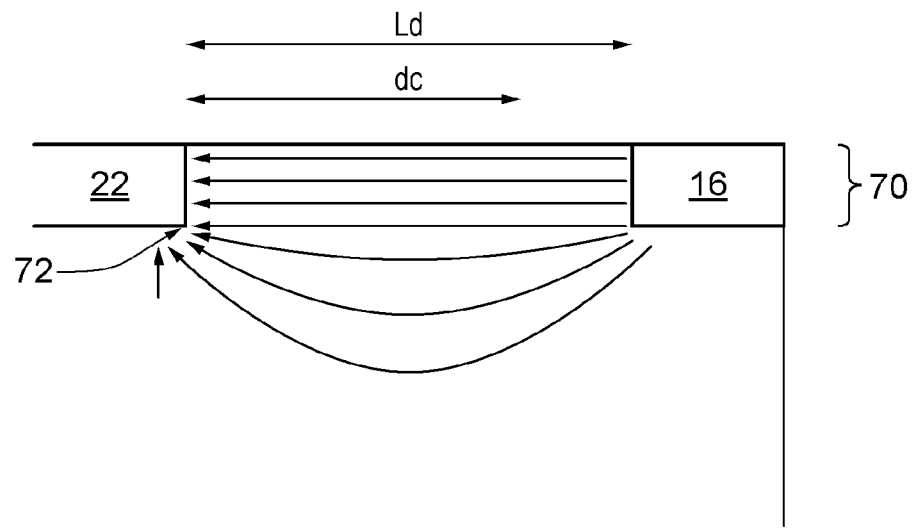
FIG. 4 schematically illustrates electric field direction between the source and the gate in a device formed in accordance with the teachings of this disclosure.

Another parameter which effects the operation of the device is the electric field gradient around the top gate. FIG. 4 schematically illustrates electric fields between the top gate 22 and the drain 16 of a device having a relatively deep channel. As shown in FIG. 4, the electric field vectors in an upper region, generally designated 70 which has a depth similar to that of the top gate 22 are generally horizontal or parallel with the surface of the device.

As we move further, deeper, into the device the electric field starts to take on a curved form, such that the electric field vectors at a corner region 72 of the top gate 22 exhibits both a horizontal and vertical component. The distance Ld between the edge of the top gate and the adjacent edge of the drain 16 is selected such that the lateral electric field to drop below a critical value for the desired maximum breakdown voltage for the device. Typically for a device having a breakdown voltage in excess of 30 volts, Ld is around 6.5 microns or so. Greater distances can be used if desired, but this increases the footprint of the device on the semiconductor wafer, and also may result in increased on-state resistance. In test devices the distance Ld has been chosen to be about 1.3 times or so greater than the minimum distance, shown as distance "dc" for setting the horizontal E-field below a threshold strength of approximately $3 \times 10^5$ Vcm$^{-1}$.

A further design choice, which can be used in combination with the preceding design choices, is to make the depth of the drain Wd greater than about 0.5 µm. This has the effect of avoiding current crowding at the surface of the device by confining the bottom gate electric field to the area beneath the drain.

Figure 5:
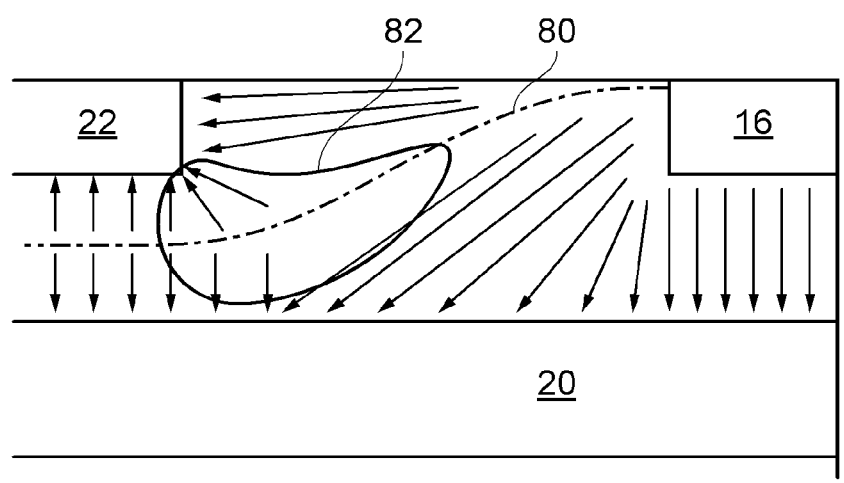
FIG. 5 is a schematic cross section through the drain to gate region of a device formed in accordance with the teachings of this disclosure, and also showing the relative position of a significant current flow path with respect to regions of electric field within the transistor.

If we consider the superposition of the E-field vectors, for example as shown in FIG. 3b with those of FIG. 4, it becomes apparent that in some regions of the device the vertical component of the E-field vector in FIG. 3b has an opposite sign to the vertical component of the E-field vector in FIG. 4, especially in the vicinity of the corner 72 of the top gate 22. This can be exploited, by appropriate selection of device geometry, to create regions of relatively low electric field, and furthermore the current path within the device can be arranged to flow predominantly within the regions of low, or at least reduced, electric field. Such an arrangement is schematically illustrated in FIG. 5. FIG. 5 shows, schematically, the E-field vectors in a completed device, and it also shows the principal path of current flow or path of significant current flow within the gate to drain region, as represented by "chain-dot" line 80. As schematically shown in FIG. 5, the majority of the current 80 flows through a region 82 of relatively weak electric field strength. By separating the region of greater current flow from the regions of greater E-field intensity the risk of impact ionization is significantly reduced. Large amounts of impact ionization can give rise to device breakdown and this is clearly undesirable. However, in the context of a J-FET any impact ionization results in the creation of a minority carrier which is swept towards the gate, be that the top gate or bottom gate, and results in the formation of a gate current. This is highly undesirable, as an important device parameter of a FET is the gate current to drain current ratio $I_g/I_d$ and this should be kept small. Typical values for $I_g/I_d$ are $1\times10^{-6}$, with target values typically of $10^{-7}$ being desirable over the entire operating voltage.

In order to facilitate the path of the current in a substantially neutral zone, it is desirable to balance the electric field components.

Figure 6:
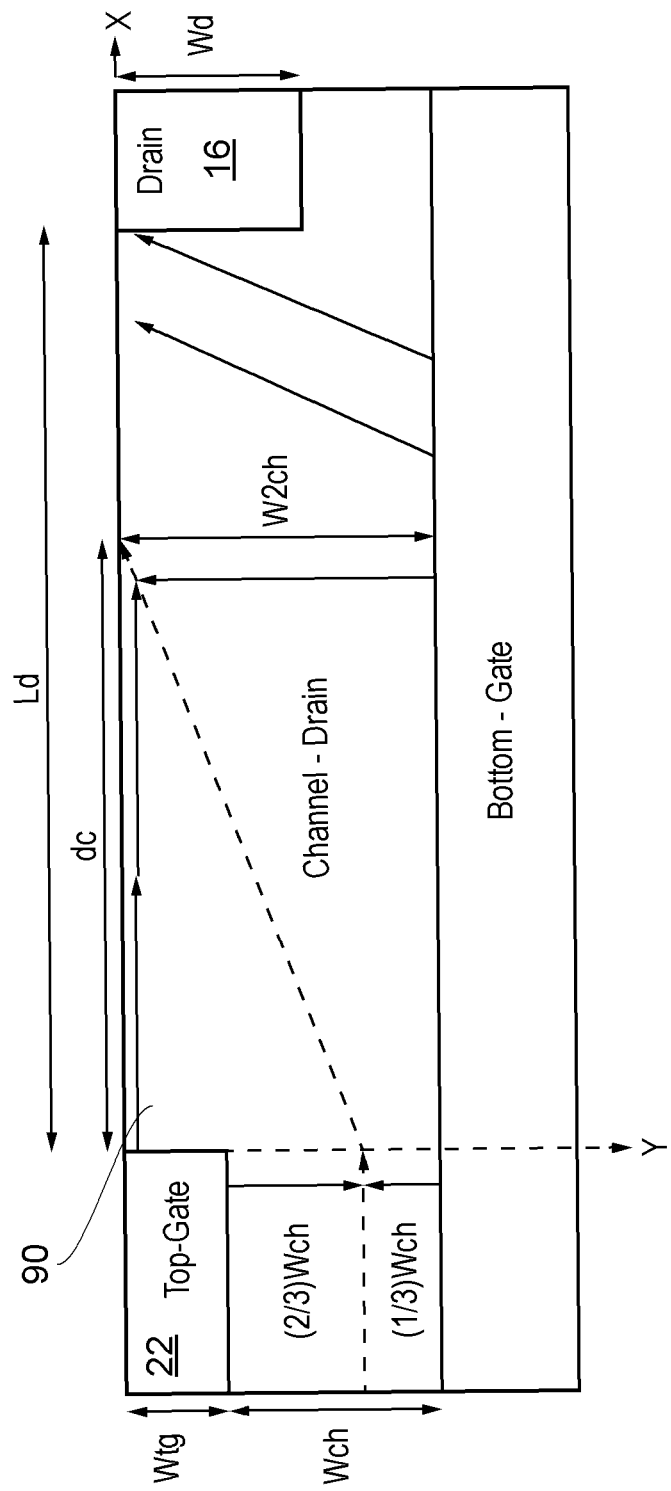
FIG. 6 shows device geometry in a schematic form.

FIG. 6 reproduces the device layout previously discussed with respect to FIG. 2. FIG. 6 schematically shows the current path, and the E-field components. To keep the current path out of the region of stronger E-field, such region being generally designated 90 in FIG. 6, of substantially horizontal field near the top gate 22 at the surface of the device, we wish the electric field from the top-gate to be equal to the electric field from the bottom-gate. As the bottom-gate is generally formed early in the transistor process formation, it receives a larger thermal budget and therefore, the channel—back-gate junction can be approximated by a linearly graded junction. However, for enhanced device performance it is desirable to have a low top-gate resistance for reduced noise, this higher doping for the top-gate 22 means that the top-gate—channel junction can be approximated as a one sided step junction. The difference in electric field between a one-sided junction and a linearly graded junction means that the electric field strength from the top-gate 22 is twice that of the bottom gate and therefore to achieve a balanced field with equal potential on the top and bottom gate terminals, the majority of the current should flow in a current path that at every point along the path is about twice the distance from the top-gate as it is from the bottom gate. This, to a first approximation, can be achieved by selecting dimensions such that $$W2ch = \frac{dc}{2}$$

However, the above analysis assumes that the influence of the drain ohmic diffusion can be neglected on the backgate electric field. However, for this to be a substantially valid assumption, it is desirable to separate the drain at least an additional 1.3 times beyond the minimum distance "dc." Therefore, this redefines the vertical backgate depth "W2ch" and with respect to the layout defined lateral distance "Ld" as:

$$W2ch = \frac{Ld}{2 \cdot K}$$

where K represents a ratio between Ld and dc. K is generally greater than about 1.3.

Tolerances allowed by the doping diffusions enable the depth to the back gate to be rewritten as:

$$W2ch = \frac{Ld}{\beta}$$

$\beta$=3-4 (Although values of $\beta$ as low as 2.5 may be acceptable)

Figure 7:
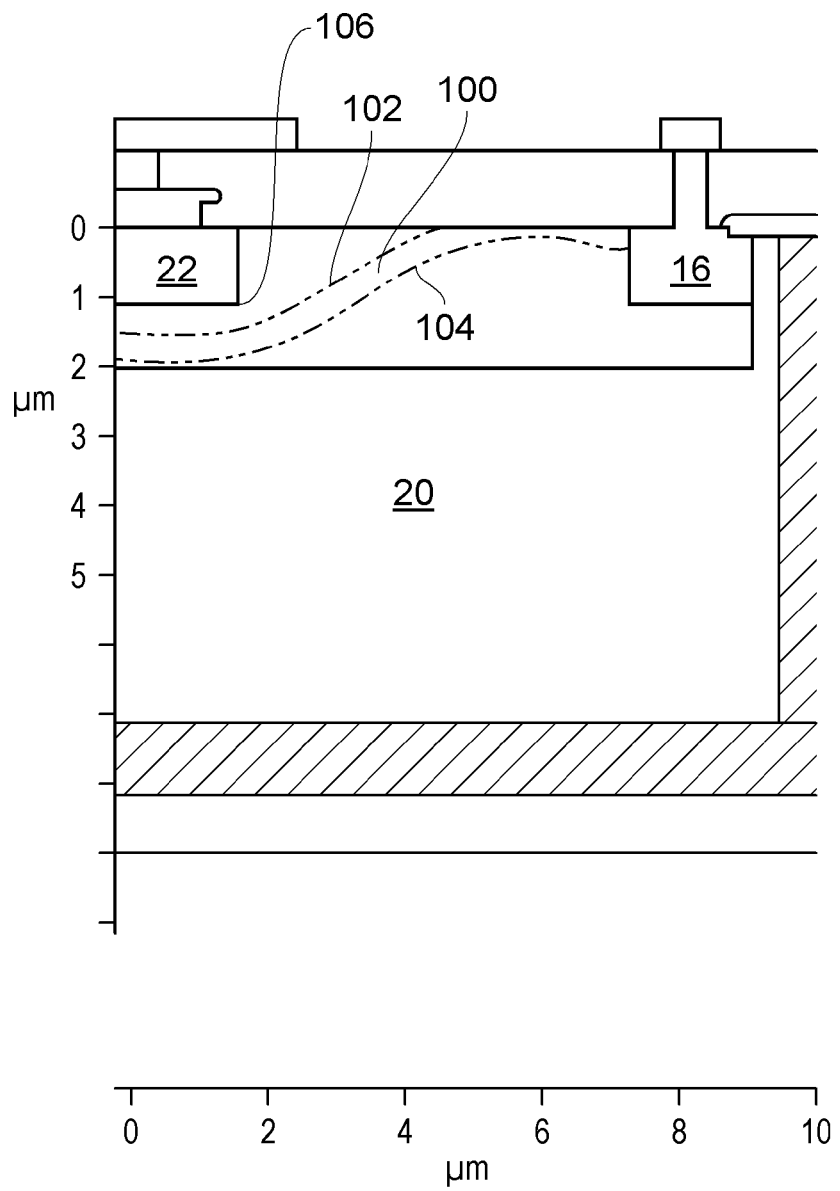
FIG. 7 shows a simulation of current flow path in a device formed in accordance with the teachings of this document.

FIG. 7 is a simulation showing the current path from beneath the top gate 22 to the drain 16 in a device where The top gate depth=1 μm
The channel depth=2 μm
Ld≅6 μm
Drain depth, Wd=1 μm Thus in this example $\beta$=3.

It can be seen that the current flow, as represented by the region 100 bounded by the broken line 102 and 104, stays away from the corner 106 at the edge of the top gate 22.

Figure 8:
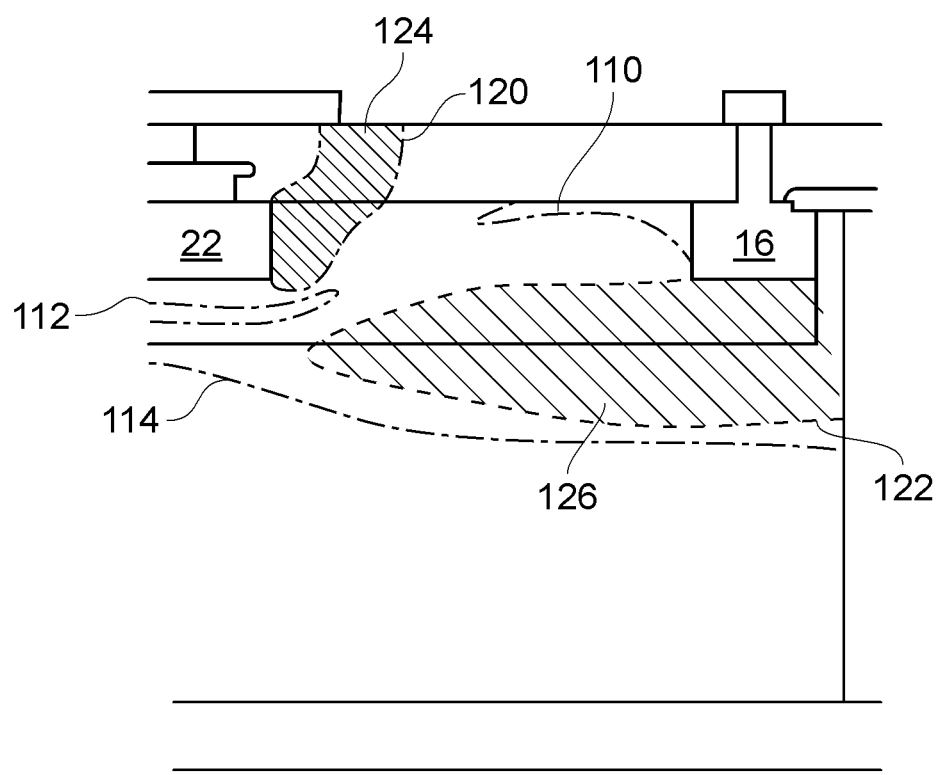
FIG. 8 schematically illustrates the depletion regions and areas of high E-field intensity.

FIG. 8 shows the device of FIG. 7, but includes the estimated positions of depletion region boundaries, as indicated by chain-dot lines 110, 112 and 114. Additionally "chain" lines 120 and 122 represent the spatial extent of regions 124 and 126, as identified by being hatched in FIG. 8, where the E-field strength exceeds $6\times10^4$ V/cm.

Figure 9:
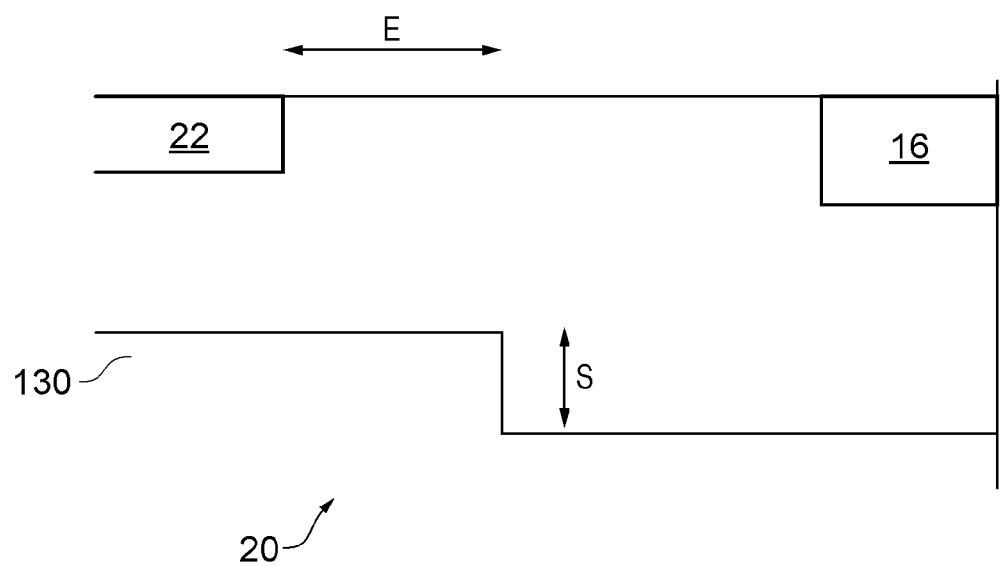
FIG. 9 shows a modification to the back gate profile.

In the arrangement shown so far the lower boundary of the channel has been planar. However this need not be the case and the devices discussed hereinbefore may be modified by the inclusion of a non-planar channel to back gate boundary. Such an arrangement is shown in FIG. 9. As shown in FIG. 9 a step 130 has been formed in the back gate 20. The step is of the same semiconductor material/doping type as the back gate 20. Various ways of forming the step 20 will be evident to the person skilled in the art. One way may be to mask the back gate, and reveal an opening where the step will be. This region can then be doped to a higher concentration than the rest of the back gate. The mask is then removed and the transistor has epitaxial layers formed over the back gate. These layers are doped so as to become the channel. During annealing the increased doping in region 20 diffuses and creates a step region (which will have rounded edges) extending into the channel. Alternatively the step can be formed by performing a plurality of epitaxial-growth stages and performing doping to form the step at the bottom of the channel before completing the remainder of the formation of the channel.

The step 130 can extend from the foot of the channel by a height S. Furthermore the edge of the step 130 can be offset from the edge of the top gate 22 by a distance E, as shown in FIG. 9. The distance E can be a positive or negative number. Thus, whereas FIG. 9 illustrates a step 130 of greater lateral extent than the top gate 22, the step 130 could also be of reduced lateral extent.

This step allows the first channel region 12.1 to be defined independently of the vertical and lateral ratios chosen for field balancing in the channel—drain region. The current from the field neutral channel region can still be injected into the field neutral channel—drain region because the step 130 is the source of a depletion region that extends both vertically and laterally as opposed to just vertically when there is no step. This depletion from two directions weakens the bottom-gate electric field relative to the top-gate in channel region and causes XBCH to tend to 0. Therefore, for minimum impact ionization the dimensions Wch and W2ch are related by:

$$di = Wtg + Wch \text{ (In channel region)}$$

$$di = \frac{2(W2ch - Wtg)}{3} + Wtg \text{ (Leaving Channel region)}$$

$$\therefore Wch = \frac{2(W2ch - Wtg)}{3}$$

In more general terms for a JFET with or without a step 130, the ranges of structures can be expressed as:

$$Wch = \alpha(W2ch - Wtg)$$

$$\alpha = 0.5 - 1.0$$

The factor α takes account of tolerances in the positions of the doping regions, and that some misalignment is acceptable.

It can therefore be observed that:

Poor gate current (Ig) to drain (Id) ratio is a result of regions of high current density occurring in regions of high E-field intensity (for example where the E field intensity is above a threshold value where impact ionization becomes non-negligible). This is especially true where the action of the E-field is aligned with the direction of current flow, giving rise to increased risk of impact ionization and hence generation of minority carriers which manifest themselves as a gate current.

The drain current of a JFET is governed by a two dimensional balance of competing depletion regions.

The most significant depletion regions are laterally from the top gate, and vertically from the bottom gate.

Provision of increased distance Ld from the top gate to the drain reduces the lateral E-field strength. The field does not reduce linearity with distance because it is acting within a semiconducting material, and not a dielectric.

Increasing the depth of the drain contact to the channel reduces the vertical E-field strength.

It is advantageous to avoid having a heavily doped back gate near the channel to drain region so as to avoid high E-field intensities from the back gate competing with the E-field from the drain.

Suitable arrangement of device geometry and doping enables the regions of very high E-fields to be kept away from the regions of increased current density, thereby reducing the incidence of impact ionization for a given set of operating conditions.

The highly doped drain region should be formed at a sufficient distance from the surface of the device to shield a surface conduction current path from the vertical E-field.

The channel depth should be sufficiently great to separate the conduction path from the regions of high field intensity at the corner of the top gate.

It is thus possible to use these rules to assist in the design of the relative sizes and positions of doped regions within a JFET so as to reduce Ig/Id.

The techniques described herein can be applied equally to both N channel and P channel devices.

The claims have been presented in single dependency format suitable for presentation to the USPTO. However it is to be understood that any claim may depended on any preceding claim of the same category except where that is clearly infeasible.

What is claimed is:

1. A junction field effect transistor comprising:
   a channel;
   a gate; and
   a drain and a source, wherein the drain and the source are in controllable current flow communication by way of the channel,
   wherein a depth di of current flow is represented by:

$$di = Wtg + \left(\frac{2Wch}{3}\right)$$

where Wtg represents a depth of the top gate, and Wch represents a width of the channel between the top gate and the back gate.

2. A junction field effect transistor as claimed in claim 1, in which a depth of the drain exceeds 0.5 μm.

3. A junction field effect transistor as claimed in claim 1, in which a depth W2ch of the channel, is related to a distance Ld between the gate and the source by $$W2ch = \frac{Ld}{\beta}$$

where β is a coefficient greater than 2.5.

4. A junction field effect transistor as claimed in claim 3, where β is in the range $3 \leq \beta \leq 4$.

5. A junction field effect transistor as claimed in claim 1, where a width Wch of the channel in a first channel region beneath the gate is related to a channel depth W2ch in a region between the gate and the drain by $$Wch = \alpha(W2ch - Wtg)$$

where Wtg is a depth of the gate, and a is a coefficient between 0.5 and 1.

6. A junction field effect transistor as claimed in claim 1, in which, for a given maximum design voltage, the distance Ld between the gate and the source is at least 1.3 times greater than a distance for setting a horizontal electric field between the gate and the source below a threshold strength of substantially $3 \times 10^5$ Vcm$^{-1}$.

7. A junction field effect transistor as claimed in claim 1, in which, in use and at a maximum design operating voltage, the ratio of gate current to drain current is less than $10^{-7}$.

8. An integrated circuit comprising at least one transistor as claimed in claim 1.

9. A junction field effect transistor as claimed in claim 1, wherein a first channel dimension is selected such that the majority of current flow in the channel occurs in a region where electric field strength is below a threshold at which impact ionization is negligible.

10. A junction field effect transistor comprising:
    a channel;
    a gate; and
    a drain and a source, wherein the drain and source are in controllable current flow communication by way of the channel,
    wherein the gate is a top gate and the junction field effect transistor further comprises a back gate, and wherein a separation Ld between the top gate and the drain is related to a depth of the channel between the top gate and the drain by $$W2ch = \frac{Ld}{\beta}$$

where W2ch is the channel depth (distance to the top of the back gate), and
    β is a coefficient greater than 2.5.

11. A junction field effect transistor as claimed in claim 10, where a width Wch of the channel in a first channel region beneath the gate is related to a channel depth W2ch in a region between the gate and the drain by $$Wch = \alpha(W2ch - Wtg)$$

where Wtg is a depth of the gate, and α is a coefficient between 0.5 and 1.

12. A junction field effect transistor as claimed in claim 10, in which the drain has a depth of at least 0.5 μm.

13. A junction field effect transistor as claimed in claim 10, in which, for a given maximum design voltage, the distance Ld between the gate and the source is at least 1.3 times greater than a distance for setting a horizontal electric field between the gate and the source below a threshold strength of substantially $3 \times 10^5$ Vcm$^{-1}$.

14. A junction field effect transistor as claimed in claim 10, in which, in use and at a maximum design operating voltage, the ratio of gate current to drain current is less than $10^{-7}$.

15. An integrated circuit comprising at least one transistor as claimed in claim 10.

16. A junction field effect transistor as claimed in claim 10, wherein a first channel dimension is selected such that the majority of current flow in the channel occurs in a region where electric field strength is below a threshold at which impact ionization is negligible.

17. A junction field effect transistor as claimed in claim 10, in which the drain has a depth greater than a depth of the top gate Wtg.

18. A junction field effect transistor as claimed in claim 10, where $\beta$ is in the range $3 \leq \beta \leq 4$.

19. A junction field effect transistor as claimed in claim 10, in which Ld has a dimension such that at a maximum design operating voltage Ld/$\beta$ is less than a semiconductor breakdown threshold.

20. A junction field effect transistor as claimed in claim 10, in which Ld is selected such that a maximum design operating voltage Ld/$\beta$ is less than $3 \times 10^5$ Vcm$^{-1}$.

\* \* \* \* \*